(12) United States Patent
Di

(10) Patent No.: US 10,644,042 B2
(45) Date of Patent: May 5, 2020

(54) METHOD FOR MANUFACTURING ARRAY SUBSTRATE, ARRAY SUBSTRATE AND FINGERPRINT RECOGNITION DEVICE

(71) Applicant: BOE Technology Group Co., Ltd., Beijing (CN)

(72) Inventor: Yunping Di, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/984,810

(22) Filed: May 21, 2018

(65) Prior Publication Data

US 2019/0123073 A1 Apr. 25, 2019

(30) Foreign Application Priority Data

Oct. 20, 2017 (CN) .......................... 2017 1 0984474

(51) Int. Cl.
*H01L 21/00* (2006.01)
*H01L 21/84* (2006.01)
(Continued)

(52) U.S. Cl.
CPC ........ *H01L 27/1274* (2013.01); *G06K 9/0002* (2013.01); *G06K 9/00087* (2013.01);
(Continued)

(58) Field of Classification Search
CPC ......... H01L 21/02532; H01L 21/02592; H01L 21/02675; H01L 29/868
(Continued)

(56) References Cited

U.S. PATENT DOCUMENTS

| 8,686,972 B2 | 4/2014 | Kozuma et al. |
| 8,999,823 B2 | 4/2015 | Makita et al. |
| (Continued) | | |

FOREIGN PATENT DOCUMENTS

| CN | 102097488 A | 6/2011 |
| CN | 102197485 A | 9/2011 |
| (Continued) | | |

OTHER PUBLICATIONS

First Office Action, including Search Report, for Chinese Patent Application No. 201710984474.8, dated Aug. 14, 2019, 13 pages.

*Primary Examiner* — David S Blum
(74) *Attorney, Agent, or Firm* — Westman, Champlin & Koehler, P.A.

(57) ABSTRACT

A method for manufacturing an array substrate, an array substrate, and a fingerprint recognition device. The method includes: forming a plurality of polysilicon patterns on a substrate, the plurality of polysilicon patterns including a first polysilicon pattern for forming the PIN-type diode and a second polysilicon pattern for forming the transistor, each polysilicon pattern including a first sub-region, a second sub-region, and a third sub-region between the first sub-region and the second sub-region; using a first doping process to dope the first sub-region of the first polysilicon pattern and the first sub-region and the second sub-region of the second polysilicon pattern with one of P-type ions and N-type ions respectively; and using a second doping process to dope the second sub-region of the first polysilicon pattern with the other of P-type ions and N-type ions.

12 Claims, 14 Drawing Sheets

(51) Int. Cl.
  *H01L 27/12* (2006.01)
  *H01L 29/66* (2006.01)
  *H01L 21/02* (2006.01)
  *G06K 9/00* (2006.01)
  *H01L 29/786* (2006.01)
  *H01L 21/027* (2006.01)
  *H01L 27/06* (2006.01)
  *H01L 29/739* (2006.01)
  *H01L 31/10* (2006.01)

(52) U.S. Cl.
  CPC .... *H01L 21/0273* (2013.01); *H01L 21/02532* (2013.01); *H01L 21/02592* (2013.01); *H01L 21/02675* (2013.01); *H01L 27/0629* (2013.01); *H01L 27/1222* (2013.01); *H01L 27/1262* (2013.01); *H01L 27/1288* (2013.01); *H01L 29/6609* (2013.01); *H01L 29/66757* (2013.01); *H01L 29/7391* (2013.01); *H01L 29/78621* (2013.01); *H01L 29/78675* (2013.01); *H01L 31/10* (2013.01)

(58) Field of Classification Search
  USPC .......................................................... 438/154
  See application file for complete search history.

(56) References Cited

U.S. PATENT DOCUMENTS

| | | | |
|---|---|---|---|
| 2004/0245574 A1* | 12/2004 | Ker | H01L 27/1233 257/356 |
| 2005/0077577 A1* | 4/2005 | Manna | H01L 27/0255 257/355 |
| 2012/0147286 A1 | 6/2012 | Oda et al. | |

FOREIGN PATENT DOCUMENTS

| | | | |
|---|---|---|---|
| CN | 102473792 A | | 5/2012 |
| CN | 105633095 A | * | 6/2016 |
| CN | 105633095 A | | 6/2016 |

* cited by examiner

METHOD FOR MANUFACTURING ARRAY SUBSTRATE, ARRAY SUBSTRATE AND FINGERPRINT RECOGNITION DEVICE

CROSS-REFERENCE TO RELATED APPLICATION

This application claims the benefit of Chinese Patent Application No. 201710984474.8 filed on Oct. 20, 2017 in the State Intellectual Property Office of China, the disclosure of which is incorporated herein by reference in entirety.

BACKGROUND

Technical Field

At least one aspect of the present disclosure relates to the field of sensor technology, and more particularly to a method for manufacturing an array substrate, an array substrate, and a fingerprint recognition device.

Description of the Related Art

Fingerprint recognition technology is widely used in personal identity verification. According to the methods of fingerprint acquisition and fingerprint input, the fingerprint recognition technology that is widely used and well-known at present includes: optical imaging, thermal-sensitive sensor, human body far-infrared sensor, and other recognition technologies.

At present, compared with a capacitive fingerprint recognition device, an ultrasonic fingerprint recognition device may be waterproof and sweatproof, formed as a large-area sensor and adapted to recognize a fake fingerprint and support for a thicker encapsulation layer. In addition, by means of ultrasound, it may also perform other function recognitions, such as pulse recognition, blood pressure recognition. It is necessary for an ultrasonic fingerprint recognition product to integrate a CMOS transistor device with a PIN-type diode device. In the related art, during a semiconductor manufacturing process on a wafer silicon substrate, the manufacturing process of the CMOS transistor device and the manufacturing process of the PIN-type diode device are separated, thereby resulting in a complicated process for manufacturing the ultrasonic fingerprint recognition device and a high process cost.

SUMMARY

In at least one embodiment of the present disclosure, there is provided a method for manufacturing an array substrate, an array substrate, and a fingerprint recognition device.

In an aspect of the present disclosure, there is provided a method for manufacturing an array substrate comprising a plurality of target region groups, each target region groups comprising a PIN-type diode and a transistor, and the method for manufacturing the array substrate comprising steps of:

forming a plurality of polysilicon patterns on a substrate, the plurality of polysilicon patterns comprising a first polysilicon pattern for forming the PIN-type diode and a second polysilicon pattern for forming the transistor, each polysilicon pattern comprising a first sub-region, a second sub-region, and a third sub-region between the first sub-region and the second sub-region;

using a first doping process to dope the first sub-region of the first polysilicon pattern, and the first sub-region and the second sub-region of the second polysilicon pattern with one of P-type ions and N-type ions, respectively; and using a second doping process to dope the second sub-region of the first polysilicon pattern with the other of the P-type ions and the N-type ions.

According to at least one embodiment of the present disclosure, the transistor comprises a P-type transistor and an N-type transistor, and the second polysilicon pattern comprises a third polysilicon pattern for forming the P-type transistor and a fourth polysilicon pattern for forming the N-type transistor, and the step of using the first doping process to dope the first sub-region of the first polysilicon pattern, and the first sub-region and the second sub-region of the second polysilicon pattern with the one of P-type ions and N-type ions, respectively comprises steps of:

forming a metal layer on the plurality of polysilicon patterns, and performing a first patterning to the metal layer so that the metal layer covers the fourth polysilicon pattern, the third sub-region of the third polysilicon pattern, and the second sub-region and the third sub-region of the first polysilicon pattern; and doping the first sub-region of the first polysilicon pattern, and the first sub-region and the second sub-region of the third polysilicon pattern with the P-type ions, to form a P-doped region of the PIN-type diode and a P-doped region of the P-type transistor.

According to at least one embodiment of the present disclosure, the fourth polysilicon pattern further comprises two fourth sub-regions located between the first sub-region and the third sub-region and between the second sub-region and the third sub-region, respectively, and the step of using the second doping process to dope the second sub-region of the first polysilicon pattern with the other of the P-type ions and the N-type ions comprises steps of:

performing a second patterning to the metal layer so that the metal layer covers the third sub-region of the fourth polysilicon pattern, the third sub-region of the third polysilicon pattern, and the second sub-region and the third sub-region of the first polysilicon pattern;

forming a first photoresist layer, and performing a first patterning to the first photoresist layer so that the first photoresist layer covers the third sub-region and the fourth sub-region of the fourth polysilicon pattern, the third polysilicon pattern, and the first polysilicon pattern; and doping the first sub-region and the second sub-region of the fourth polysilicon pattern with N-type ions, to form an N-doped region of the N-type transistor.

According to at least one embodiment of the present disclosure, the step of using the second doping process to dope the second sub-region of the first polysilicon pattern with the other of the P-type ions and the N-type ions further comprises steps of:

performing a second patterning to the first photoresist layer so that the first photoresist layer covers the third sub-region of the fourth polysilicon pattern, the third polysilicon pattern, and the first polysilicon pattern; and doping the fourth sub-region of the fourth polysilicon pattern, to form a lightly-doped drain region of the N-type transistor.

According to at least one embodiment of the present disclosure, the first polysilicon pattern further comprises a fourth sub-region located between the second sub-region and the third sub-region, and the step of using the second doping process to dope the second sub-region of the first polysilicon pattern with the other of the P-type ions and the N-type ions further comprises steps of:
  performing a third patterning to the metal layer so that the metal layer covers the third sub-region of the fourth polysilicon pattern, the third sub-region of the third polysilicon pattern, and the third sub-region of the first polysilicon pattern;
    forming a second photoresist layer, and performing a first patterning to the second photoresist layer so that the second photoresist layer covers the fourth polysilicon pattern, the third polysilicon pattern, and the first sub-region, the third sub-region and the fourth sub-region of the first polysilicon pattern; and
  doping the second sub-region of the first polysilicon pattern with the N-type ions, to form an N-doped region of the PIN-type diode.

According to at least one embodiment of the present disclosure, after the step of doping the second sub-region of the first polysilicon pattern with the N-type ions, the method further comprises steps of:
  performing a second patterning to the second photoresist layer so that the second photoresist layer covers the fourth polysilicon pattern, the third polysilicon pattern, and the first sub-region and the third sub-region of the first polysilicon pattern; and
  doping the fourth sub-region of the first polysilicon pattern, to form a lightly-doped drain region of the PIN-type diode.

According to at least one embodiment of the present disclosure, the fourth polysilicon pattern further comprises two fourth sub-regions located between the first sub-region and the third sub-region and between the second sub-region and the third sub-region, respectively, and the first polysilicon pattern further comprises a fourth sub-region located between the second sub-region and the third sub-region, and
the step of using the second doping process to dope the second sub-region of the first polysilicon pattern with the other of the P-type ions and the N-type ions comprises:
  performing a second patterning to the metal layer so that the metal layer covers the third sub-region of the fourth polysilicon pattern, the third sub-region of the third polysilicon pattern, and the third sub-region of the first polysilicon pattern;
  forming a fifth photoresist layer, and performing a first patterning to the fifth photoresist layer so that the fifth photoresist layer covers the third sub-region and the fourth sub-region of the fourth polysilicon pattern, the third polysilicon pattern, and the first sub-region, the third sub-region and the fourth sub-region of the first polysilicon pattern; and
  doping the first sub-region and the second sub-region of the fourth polysilicon pattern and the second sub-region of the first polysilicon pattern with the N-type ions, to form an N-doped region of the N-type transistor and an N-doped region of the PIN-type diode.

According to at least one embodiment of the present disclosure, after the step of doping the first sub-region and the second sub-region of the fourth polysilicon pattern and the second sub-region of the first polysilicon pattern with the N-type ions, to form the N-doped region of the N-type transistor and the N-doped region of the PIN-type diode, the method further comprises steps of:
  performing a second patterning to the fifth photoresist layer so that the fifth photoresist layer covers the third sub-region of the fourth polysilicon pattern, the third polysilicon pattern, and the first sub-region and the third sub-region of the first polysilicon pattern; and
  doping the fourth sub-region of the fourth polysilicon pattern and the fourth sub-region of the first polysilicon pattern, to form a lightly-doped drain region of the N-type transistor and a lightly-doped drain region of the PIN-type diode.

According to at least one embodiment of the present disclosure, the transistor comprises a P-type transistor and an N-type transistor, the second polysilicon pattern comprises a third polysilicon pattern for forming the P-type transistor and a fourth polysilicon pattern for forming the N-type transistor, the fourth polysilicon pattern further comprises two fourth sub-regions located between the first sub-region and the third sub-region and between the second sub-region and the third sub-region, respectively, and the first polysilicon pattern further comprises a fourth sub-region located between the second sub-region and the third sub-region, and
the step of using the first doping process to dope the first sub-region of the first polysilicon pattern, and the first sub-region and the second sub-region of the second polysilicon pattern with one of the P-type ions and the N-type ions respectively comprises steps of:
  forming a metal layer on the plurality of polysilicon patterns, and performing a first patterning to the metal layer so that the metal layer covers the third sub-region of the fourth polysilicon pattern, the third sub-region of the third polysilicon pattern, and the third sub-region of the first polysilicon pattern;
  forming a sixth photoresist layer, and performing a first patterning to the sixth photoresist layer so that the sixth photoresist layer covers the third sub-region and the fourth sub-region of the fourth polysilicon pattern, the third polysilicon pattern, and the first sub-region, the third sub-region, and the fourth sub-region of the first polysilicon; and
  doping the first sub-region and the second sub-region of the fourth polysilicon pattern and the second sub-region of the first polysilicon pattern with the N-type ions, to form an N-doped region of the N-type transistor and an N-doped region of the PIN-type diode.

According to at least one embodiment of the present disclosure, after the step of doping the first sub-region and the second sub-region of the fourth polysilicon pattern and the second sub-region of the first polysilicon pattern with the N-type ions, to form the N-doped region of the N-type transistor and the N-doped region of the PIN-type diode, the method further comprises steps of:
  performing a second patterning to the sixth photoresist layer so that the sixth photoresist layer covers the third sub-region of the fourth polysilicon pattern, the third polysilicon pattern, and the first sub-region and the third sub-region of the first polysilicon pattern; and
  doping the fourth sub-region of the fourth polysilicon pattern and the fourth sub-region of the first polysilicon pattern, to form a lightly-doped drain region of the N-type transistor and a lightly-doped drain region of the PIN-type diode.

According to at least one embodiment of the present disclosure, the step of using the second doping process to dope the second sub-region of the first polysilicon pattern with the other of the P-type ions and the N-type ions further comprises steps of:
  forming a seventh photoresist layer, and patterning the seventh photoresist layer so that the seventh photoresist layer covers the fourth polysilicon pattern, the third sub-region of the third polysilicon pattern, and the second sub-region, the third sub-region and the fourth sub-region of the first polysilicon pattern; and doping the first sub-region of the first polysilicon pattern, and the first sub-region and the second sub-region of the third polysilicon pattern with the P-type ions, to form a P-doped region of the PIN-type diode and a P-doped region of the P-type transistor.

According to at least one embodiment of the present disclosure, after the step of forming the plurality of polysilicon patterns on the substrate, the method further comprises steps of:

forming a third photoresist layer covering the fourth polysilicon pattern; and lightly doping the third polysilicon pattern and the first polysilicon pattern, to form a channel region of the P-type transistor having a threshold voltage and an I region of the PIN-type diode.

According to at least one embodiment of the present disclosure, after the step of forming the plurality of polysilicon patterns on the substrate, the method further comprises steps of:

forming a fourth photoresist layer covering the first polysilicon pattern and the third polysilicon pattern; and lightly doping the fourth polysilicon pattern, to form a channel region of the N-type transistor having a threshold voltage.

According to another aspect of the present disclosure, there is provided an array substrate manufactured by the method according to any one of the above embodiments.

According to a further aspect of the present disclosure, there is provided a fingerprint recognition device, comprising the array substrate according to the above embodiment.

BRIEF DESCRIPTION OF THE DRAWINGS

The above and other features of the present disclosure will become more apparent by describing in detail exemplary embodiments thereof with reference to the accompanying drawings, in which:

FIGS. 3A to 3O are cross-sectional views of an array substrate illustrating processes of a method for manufacturing an array substrate according to an exemplary embodiment of the present disclosure, wherein

DETAILED DESCRIPTION OF PREFERRED EMBODIMENTS

Figure 1:
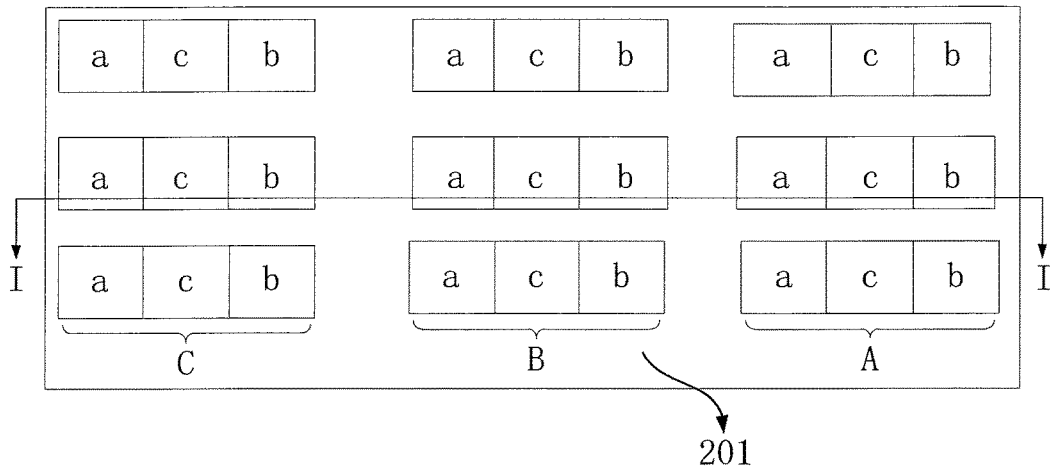
FIG. 1 is a schematic view of an array substrate with a plurality of polysilicon patterns formed according to an exemplary embodiment of the present disclosure.

In view of the complexity of the processes for manufacturing an ultrasonic fingerprint recognition device and the high process cost in the related art, embodiments of the present disclosure provide a method for manufacturing an array substrate, an array substrate, and a fingerprint recognition device.

Next, a method for manufacturing an array substrate, an array substrate, and a fingerprint recognition device provided by embodiments of the present disclosure will be described in detail with reference to the accompanying drawings. The thickness and the shape of each film or layer in the drawings are not illustrated in real scale, and it is only intended to schematically illustrate the present disclosure.

Figure 2:
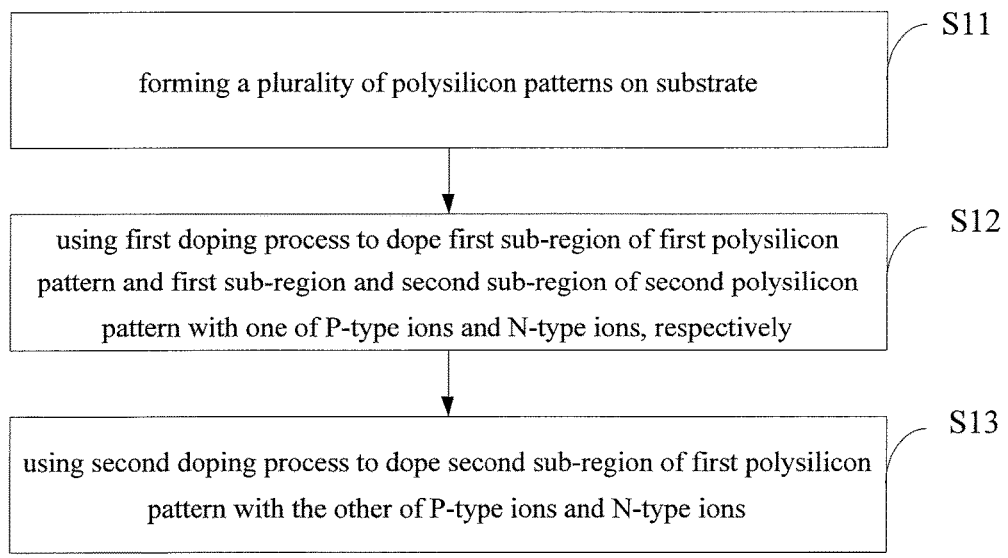
FIG. 2 is a flowchart of a method for manufacturing an array substrate according to an exemplary embodiment of the present disclosure.

According to a creative concept of the present disclosure in a first aspect, there is provided a method for manufacturing an array substrate, wherein the array substrate includes a plurality of target region groups, each of the target region groups including at least a PIN-type diode and a transistor. As shown in FIG. 2, the method for manufacturing the array substrate includes the following steps:

S11: as shown in FIG. 1, forming a plurality of polysilicon patterns on a substrate 201, the plurality of polysilicon patterns comprising a first polysilicon pattern A for forming the PIN-type diode and second polysilicon patterns B and C for forming the transistor, each polysilicon pattern comprising a first sub-region a, a second sub-region b, and a third sub-region c between the first sub-region a and the second sub-region b;

S12: using a first doping process to dope the first sub-region of the first polysilicon pattern A and the first sub-region and the second sub-region of the second polysilicon pattern B or C with one of P-type ions and N-type ions, respectively; and S13: using a second doping process to dope the second sub-region of the first polysilicon pattern with the other of P-type ions and N-type ions.

It should be noted that, the array substrate shown in FIG. 1 includes three rows of target region groups, and the polysilicon patterns formed in each target region group are square. It can be understood that, the array substrate may include more target region groups, and the shape and distribution of the polysilicon patterns in each target region group may be set as necessary. Herein, the size, shape, distribution and number of the polysilicon patterns in each target region group are not limited. In order to more clearly illustrate the structure of the array substrate, in each polysilicon pattern in the following figures, the left sub-region is named as the first sub-region a, the right sub-region is named as the second sub-region b, and the middle sub-region is named as the third sub-region c. Therefore, the sub-regions are not labeled in the following figures.

It can be appreciated for those skilled in the art that the order of the step S12 and the step S13 may be interchanged.

According to the method of the embodiments of the present disclosure, since the first polysilicon pattern A is used for forming the PIN-type diode, a P-doped region and an N-doped region of the PIN-type diode may be formed through the first doping process and the second doping process, meanwhile, a P-doped region or an N-doped region of the transistor may be formed. In this way, the manufacturing process of the transistor may be integrated with the manufacturing process of the PIN-type diode, thereby simplifying the processes for manufacturing the array substrate and reducing the manufacturing cost.

In practical applications, the transistor includes a P-type transistor and an N-type transistor. In the embodiments of the present disclosure, the transistor and the PIN-type diode are integrated in the same one array substrate, specifically, it includes the following examples:

Example 1

The array substrate includes two kinds of devices of PIN-type diodes and P-type transistors. During the process, the first sub-region of the first polysilicon pattern for the PIN-type diode and the first sub-region and the second sub-region of the second polysilicon pattern for the P-type transistor are simultaneously doped with P-type ions by a first doping process. In this way, a P-doped region of the PIN-type diode and a P-doped region of the P-type transistor are formed by the first doping process, and an N-doped region of the PIN-type diode is formed by a second doping process.

Example 2

The array substrate includes two kinds of devices of PIN-type diodes and N-type transistors. During the process, the first sub-region of the first polysilicon pattern for the PIN-type diode and the first sub-region and the second sub-region of the second polysilicon pattern for the N-type transistor are simultaneously doped with N-type ions by a first doping process. In this way, an N-doped region of the PIN-type diode and an N-doped region of the N-type transistor are formed by the first doping process, and a P-doped region of the PIN-type diode is formed by a second doping process.

Example 3

The array substrate includes three kinds of devices of PIN-type diodes, P-type transistors, and N-type transistors. The second polysilicon pattern includes a third polysilicon pattern for forming a P-type transistor and a fourth polysilicon pattern for forming an N-type transistor. Thus, there are three methods to form the integration of the PIN-type diode and the transistor. The first method comprises steps of: using a first doping process to dope the first sub-region of the first polysilicon pattern for the PIN-type diode, and the first sub-region and the second sub-region of the third polysilicon pattern for the P-type transistor with P-type ions; using a second doping process to dope a second sub-region of the first polysilicon pattern for the PIN-type diode with N-type ions; and using a third doping process to dope the first sub-region and the second sub-region of the fourth polysilicon pattern for the N-type transistor with N-type ions. The second method comprises steps of: using a first doping process to dope the second sub-region of the first polysilicon pattern for the PIN-type diode and the first sub-region and the second sub-region of the fourth polysilicon pattern for the N-type transistor with N-type ions; using a second doping process to dope the first sub-region of the first polysilicon pattern for the PIN-type diode with P-type ions; and using a fourth doping process to dope the first sub-region and the second sub-region of the third polysilicon pattern for the P-type transistor with P-type ions. The third method comprises steps of: using a first doping process to dope the first sub-region of the first polysilicon pattern for the PIN-type diode and the first sub-region and the second sub-region of the third polysilicon pattern for the P-type transistor with P-type ions; and using a second doping process to dope the second sub-region of the first polysilicon pattern for the PIN-type diode and the first sub-region and the second sub-region of the fourth polysilicon pattern for the N-type transistor with N-type ions.

Therefore, the method for manufacturing the array substrate according to the embodiments of the present disclosure may be applied to various integration schemes of the PIN-type diode and the transistor. In the implementation of the present disclosure, the method for manufacturing the array substrate according to the embodiments of the present disclosure will be described in detail by taking the Example 3 as an example. It should be understood for those skilled in the art that it only needs to make a slight modification to the process of the Example 3 to obtain the Example 1 and the Example 2. For example, for the Example 1, masks used in various process steps in the Example 3 may be modified, so that positions of the masks corresponding to the N-type transistor are shielded, then the other process steps may be the same as that in the Example 3. For the Example 2, masks used in various process steps in the Example 3 may be modified, so that positions of the masks corresponding to the P-type transistor are shielded, then the other process steps may be the same as that in the Example 3.

The various embodiments (i.e., the above-described transistor include the P-type transistor and the N-type transistor) of the present disclosure will be described in detail below with reference to the accompanying drawings.

Figure 3A:
Figure 3B:
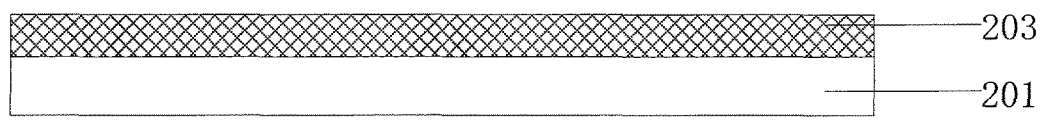
Figure 3C:
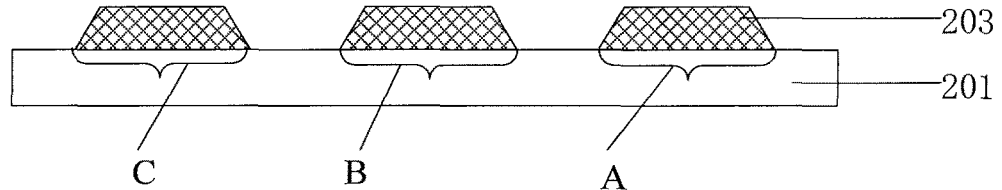
FIG. 3C is a cross-sectional view of FIG. 1 taken along line I-I.

In an embodiment, as shown in FIGS. 3a-3f and 5, the above step S11 includes the following steps:

S101: depositing an amorphous silicon (a-Si) layer 202 on the substrate 201, as shown in FIG. 3A;

S102: crystallizing the amorphous silicon layer by a laser annealing process to obtain a polysilicon layer 203 as shown in FIG. 3B;

S103: patterning the polysilicon layer 203 to obtain a plurality of polysilicon patterns as shown in FIGS. 1 and 3C. The plurality of polysilicon patterns includes a first polysilicon pattern A for forming the PIN-type diode, and second polysilicon patterns B and C for forming the transistors (TFTs), each polysilicon pattern including a first sub-region a, a second sub-region b, and a third sub-region c located between the first sub-region a and the second sub-region b. It should be understood for those skilled in the art that, in the actual manufacturing process, the order of the step S102 and the step S103 may be interchanged, that is, the amorphous silicon layer 202 shown in FIG. 3A may be patterned first, and then the patterned amorphous silicon layer 202 is subjected to a laser annealing process. In an exemplary embodiment, the first polysilicon pattern A in FIG. 3C is used to form the PIN-type diode (PIN), and the two second polysilicon patterns are used to form a PNP transistor and/or an NPN transistor respectively. Further, the third polysilicon pattern B is used to form a P-type transistor (PMOS transistor or PMOS TFT), and the fourth polysilicon pattern C is used to form an N-type transistor (NMOS transistor or NMOS TFT). It should be understood for those skilled in the art that, the number and position of the N-type transistors, the P-type transistors, and the PIN-type diodes may be set as necessary, which is not limited herein.

Figure 3D:
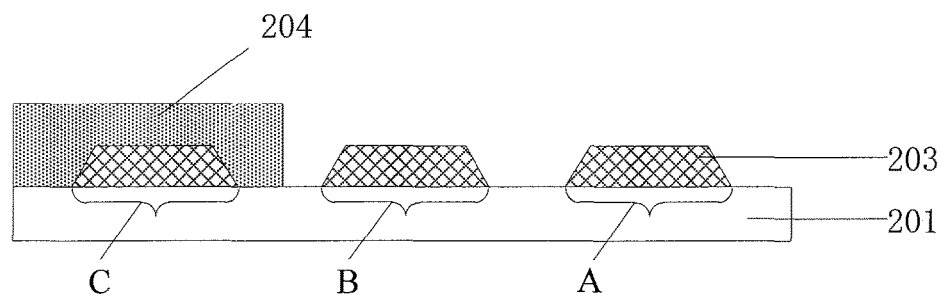
Figure 3E:
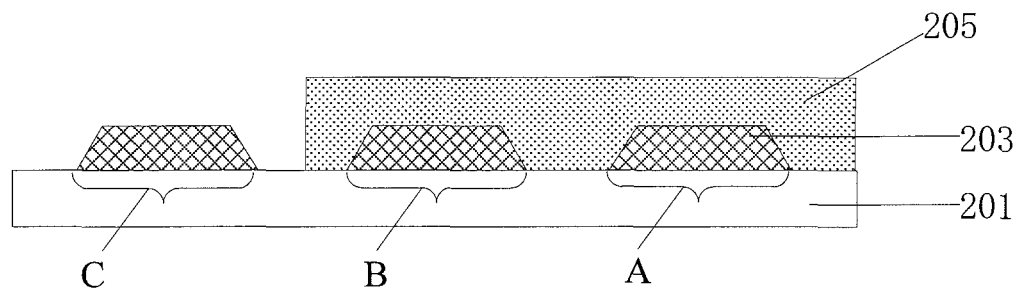

S104: lightly doping a channel region of the fourth polysilicon pattern C for the N-type transistor and a channel region of the third polysilicon pattern B for the PMOS transistor, and lightly doping a middle region of the first polysilicon pattern A for the PIN-type diode to form an I region of the PIN-type diode. Specifically, as shown in FIG. 3D, the fourth polysilicon pattern C is shielded by a third photoresist layer 204, and the first polysilicon pattern A and the third polysilicon pattern B in the polysilicon layer 203 are lightly doped, i.e., the first polysilicon pattern A and the third polysilicon pattern B are lightly doped so that the third polysilicon pattern for forming the P-type transistor forms the channel region having a specific threshold voltage, and the first polysilicon pattern forms the I region; thereafter, the third photoresist layer 204 is removed; as shown in FIG. 3E, the first polysilicon pattern A and the third polysilicon pattern B are shielded by a fourth photoresist layer 205, and the fourth polysilicon pattern C in the polysilicon layer 203 is lightly doped so that the fourth polysilicon pattern for forming the NMOS transistor forms the channel region having a specific threshold voltage; thereafter, the fourth photoresist layer 205 is removed. It should be noted that, since the doping concentration in the step S104 is relatively low, for example $10^{11}$ to $10^{12}$ cm$^{-3}$, and the first sub-region and the third sub-region will be subsequently heavily doped, as an alternative embodiment, it is unnecessary to shield the first sub-region and the third sub-region in each target region in the step S104.

Figure 3F:
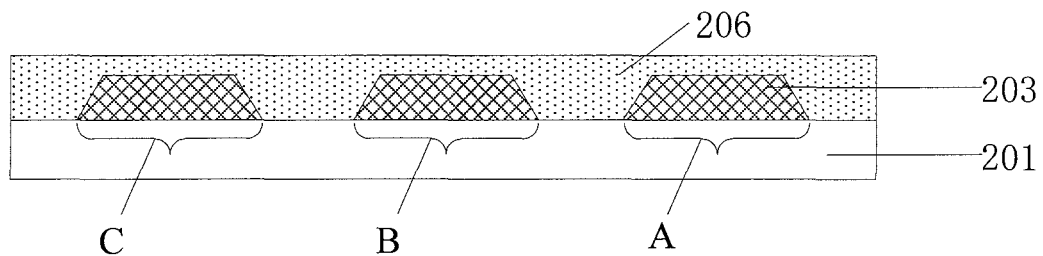

S105: forming a gate insulation layer 206 on the polysilicon layer, as shown in FIG. 3F, so as to insulate the polysilicon patterns from subsequently formed metal layers (i.e., a gate layer). It should be noted that, as the light doping is performed in the above step S104, ions can pass through the gate insulation layer, therefore the above-described steps S104 and S105 may be interchanged.

Figure 3G:
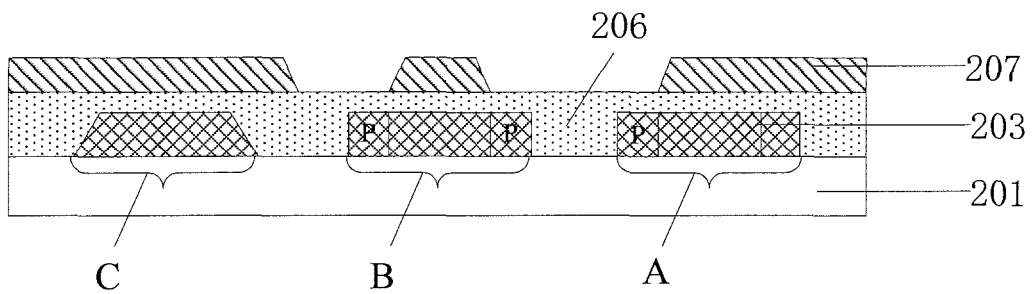
Figure 6:
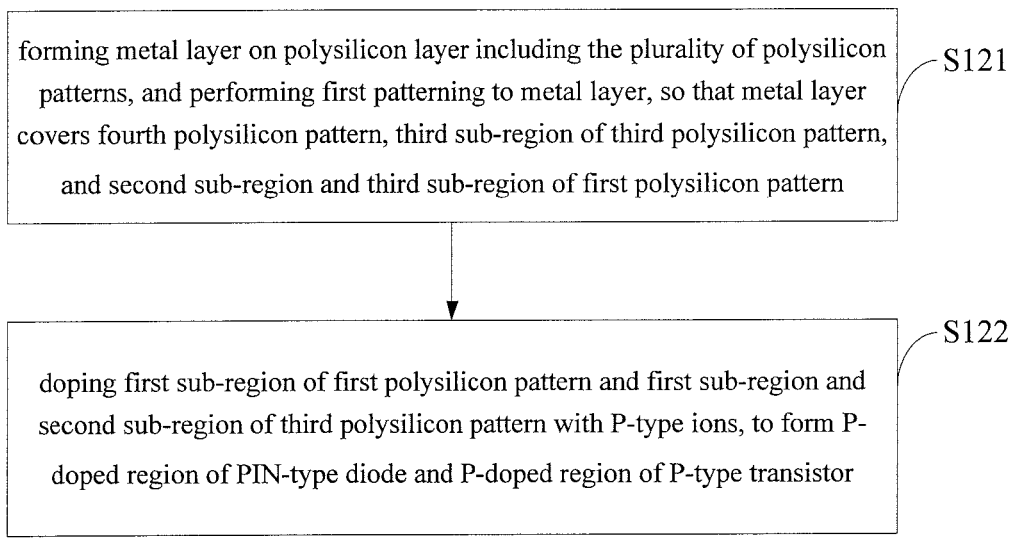
FIG. 6 is a flowchart of a part of processes of the method for manufacturing the array substrate according to another embodiment of the present disclosure.

Specifically, as shown in FIGS. 3G and 6, the above step S12 may include the following steps:

S121: forming a metal layer 207 (i.e., a gate layer) on the polysilicon layer 203 including the plurality of polysilicon patterns, and performing a first patterning to the metal layer 207, so that the metal layer 207 covers the fourth polysilicon pattern C (the target region corresponding to the N-type transistor to be formed), the third sub-region of the third polysilicon pattern B, and the second sub-region and the third sub-region of the first polysilicon pattern A, as shown in FIG. 3G. In this way, after the first patterning of the metal layer 207, only the first sub-region and the second sub-region of the third polysilicon pattern B and the first sub-region of the first polysilicon pattern A are not shielded by the metal layer 207, that is, the regions to be doped with P-type ions are not shielded by the metal layer 207.

S122: further referring to FIG. 3G, taking the metal layer 207 to which the first patterning has been performed as a mask, doping the first sub-region of the first polysilicon pattern A and the first sub-region and the second sub-region of the third polysilicon pattern B in the polysilicon layer 203 with P-type ions, for example, boron ions with a doping concentration of about $10^{13}$ to $10^{15}$ cm$^{-3}$. In this way, a P-doped region of a PIN-type diode and a P-doped region of the P-type transistor may be formed.

In the embodiments of the present disclosure, the third polysilicon pattern for forming a P-type transistor and the first polysilicon pattern for a PIN-type diode are doped with P-type ions by the same one process, therefore it may simplify the process steps and save the process cost, in addition to satisfying characteristic parameters of the P-type transistor and the PIN-type diode.

The embodiments of the present disclosure provide two processes of doping with N-type ions and doping Lightly Doped Drain (LDD) region, which will be described in detail with reference to the accompanying drawings.

Figure 3H:
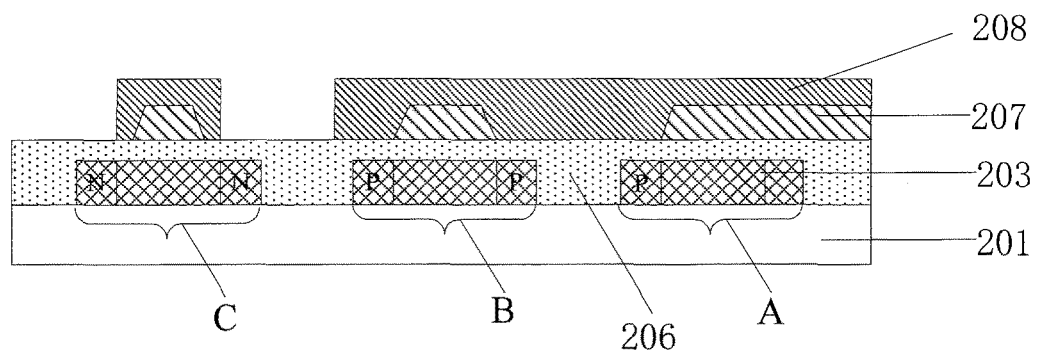
Figure 7:
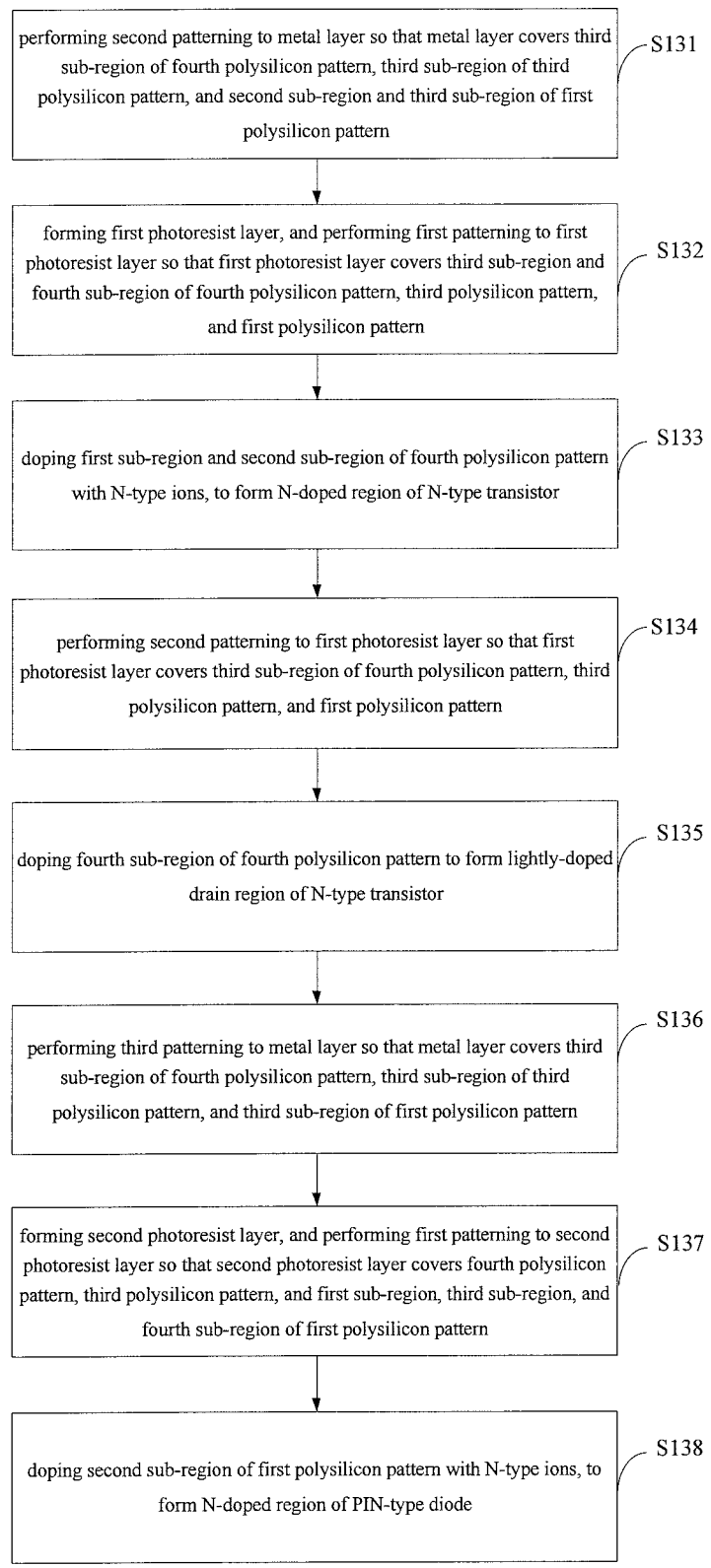
FIG. 7 is a flowchart of a part of processes of the method for manufacturing the array substrate according to a further embodiment of the present disclosure.

In an exemplary embodiment, the fourth polysilicon pattern further includes two fourth sub-regions located between the first sub-region and the third sub-region and between the second sub-region and the third sub-region, respectively. As shown in FIG. 7, the above step S13 may include the following steps:

S131: as shown in FIG. 3H, performing a second patterning to the metal layer 207 so that the metal layer 207 covers the third sub-region of the fourth polysilicon pattern C, the third sub-region of the third polysilicon pattern B, and the second sub-region and the third sub-region of the first polysilicon pattern A. In this way, after the second patterning of the metal layer 207, only the first sub-region, the second sub-region, and the fourth sub-region of the fourth polysilicon pattern are not shielded by the metal layer 207, that is, the first sub-region and the second sub-region to be doped with N-type ions and the fourth sub-region to be lightly doped in the fourth polysilicon pattern C are not shielded by the metal layer 207. The fourth sub-region of the fourth polysilicon pattern is not shielded by the metal layer 207 in the step S131, so as to subsequently form an LDD region at the position of the fourth sub-region, to reduce leakage current.

S132: further referring to FIG. 3H, forming a first photoresist layer 208, and performing a first patterning to the first photoresist layer 208 so that the first photoresist layer 208 covers the third sub-region and the fourth sub-region of the fourth polysilicon pattern, the entire third polysilicon pattern (the target region corresponding to the P-type transistor to be formed), and the entire first polysilicon pattern (the target region corresponding to the PIN-type diode to be formed). In this way, the first photoresist layer 208 to which the first patterning has been performed covers regions other than the first sub-region and the second sub-region of the fourth polysilicon pattern, that is, only the region in the fourth polysilicon pattern to be doped with N-type ions is not shielded by the first photoresist layer 208.

S133: referring to FIG. 3H, taking the first patterned photoresist layer 208 to which the first patterning has been performed as a mask, doping the first sub-region and the second sub-region of the fourth polysilicon pattern with N-type ions, for example, phosphorus ions with a certain doping concentration, to form an N-doped region of the N-type transistor.

Figure 3I:
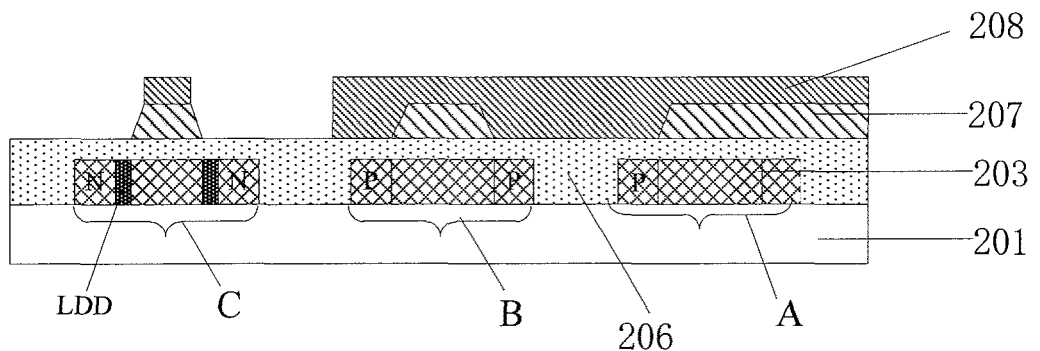

Further, as shown in FIG. 7, after the above step S133, the above step S13 may further include the following steps:

S134: as shown in FIG. 3I, performing a second patterning to the first photoresist layer 208 so that the first photoresist layer 208 covers the third sub-region of the fourth polysilicon pattern, the entire third polysilicon pattern, and the entire first polysilicon pattern. In this way, the first photoresist layer 208 to which the second patterning has been performed shields regions other than the first sub-region, the second sub-region and the fourth sub-region of the fourth polysilicon pattern, that is, only the region that has been doped with N-type ions and the region to be lightly doped in the fourth polysilicon pattern are not shielded.

S135: further referring to FIG. 3I, taking the first photoresist layer 208 to which the second patterning has been performed as a mask, doping the fourth sub-region of the fourth polysilicon pattern of the polysilicon layer 203 to form a lightly-doped drain (LDD) region of the N-type transistor. Thereafter, the first photoresist layer 208 is removed.

In the embodiments of the present disclosure, the LDD region is located between the heavily doped region (the region doped with N-type ions or P-type ions) and the channel region, functions as a transition region, to reduce the leakage current.

Figure 3J:
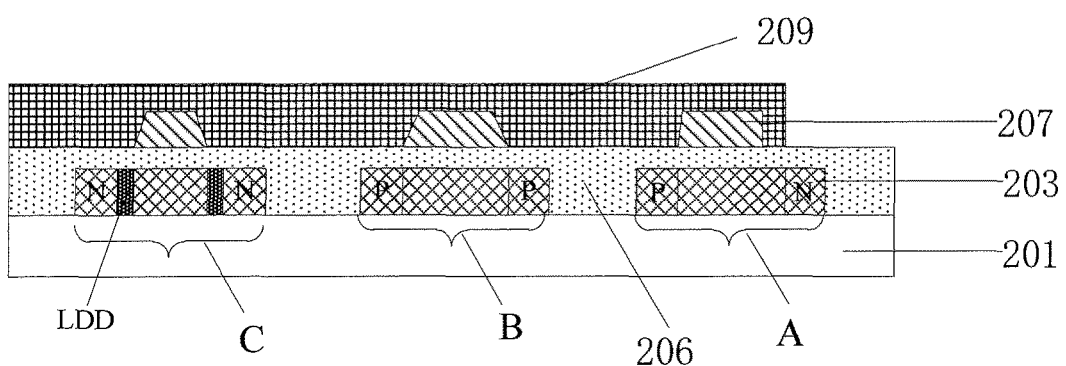

In an embodiment, the first polysilicon pattern further includes a fourth sub-region between the second sub-region and the third sub-region. Further, further referring to FIG. 7, after the step S135, the above step S13 may further include the following steps:

S136, as shown in FIG. 3J, performing a third patterning to the metal layer 207 so that the metal layer 207 covers the third sub-region of the fourth polysilicon pattern, the third sub-region of the third polysilicon pattern, and the third sub-region of the first polysilicon pattern. The metal layer 207 to which the third patterning has been performed only shields the channel regions of the PNP and NPN transistors to be formed (i.e., the third sub-regions of the third and fourth polysilicon patterns) and the I region of the PIN-type diode to be formed (i.e., the third sub-region of the first polysilicon pattern). In this way, regions that need to be doped with N-type ions and regions that need to be lightly doped of the first and fourth polysilicon patterns are not shielded by the metal layer 207.

S137: referring to FIG. 3J, forming a second photoresist layer 209, and performing a first patterning to the second photoresist layer 209 so that the second photoresist layer 209 covers the entire fourth polysilicon pattern (the target region corresponding to the N-type transistor to be formed), the entire third polysilicon pattern (the target region corresponding to the P-type transistor to be formed), and the first sub-region, the third sub-region, and the fourth sub-region of the first polysilicon pattern. In this way, the second resist layer 209 to which the first patterning has been performed shields regions other than the second sub-region of the first polysilicon pattern A, that is, only the region in the first polysilicon pattern A to be doped with N-type ions is not shielded by the second photoresist layer 209.

S138: referring to FIG. 3J, taking the second photoresist layer 209 to which the first patterning has been performed as a mask, doping the second sub-region of the first polysilicon pattern A in the polysilicon layer 203 with N-type ions, to form an N-doped region of the PIN-type diode.

In one embodiment of the present disclosure, the step of doping the first sub-region and the second sub-region of the fourth polysilicon pattern, that will form the N-type transistor, with N-type ions and the step of doping the second sub-region of the first polysilicon pattern, that will form the PIN-type diode, with N-doped ions are not performed in the same one process, thereby the concentration of the N-type ions doped into the first sub-region of the first polysilicon pattern may be individually controlled, so that the process parameters of the PIN-type diode to be formed are more flexible. In an exemplary embodiment of the present disclosure, the doping the first sub-region and the second sub-region of the third polysilicon pattern with P-type ions and the doping the first sub-region of the first polysilicon pattern with P-type ions are performed in the same process, and the step of doping the second sub-region of the first polysilicon pattern with N-type ions and the step of doping the first sub-region and the second sub-region of the fourth polysilicon pattern with N-type ions are performed in different processes. The reason to do this is that, during the step of doping with N-type ions, it is necessary to consider a width of an active layer and a width of a gate electrode, and the step of doping with N-type ions is more complicated than that of doping with P-type ions.

Figure 3K:
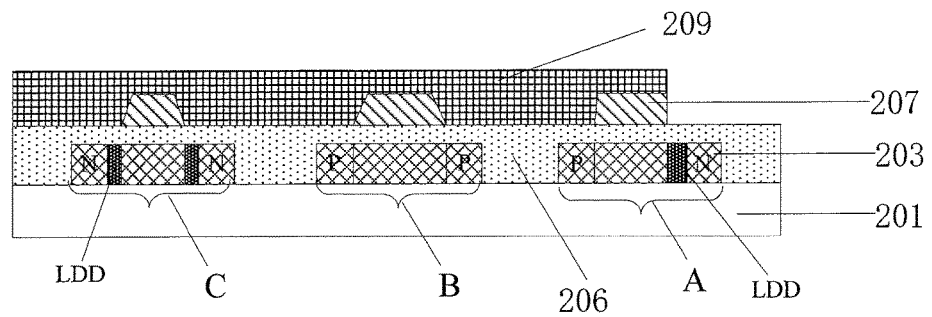

In an exemplary embodiment, after the above step S138, the method may further include the following steps:

S14: as shown in FIG. 3K, performing a second patterning to the second photoresist layer 209 so that the second photoresist layer 209 covers the entire fourth polysilicon pattern C, the entire third polysilicon pattern B, and the first sub-region and the third sub-region of the first polysilicon pattern A. In this way, the second photoresist layer 209 to which the second patterning has been performed covers regions other than the second sub-region and the second region of the first polysilicon pattern, that is, only the region doped with N-type ions and the region to be lightly doped in the first polysilicon pattern are not shielded.

S15: further referring to FIG. 3K, taking the second photoresist layer 209 to which the second patterning has been performed as a mask, doping the fourth sub-region of the first polysilicon pattern of the polysilicon layer 203 to form a lightly-doped drain (LDD) region of the PIN-type diode.

Figure 4A:
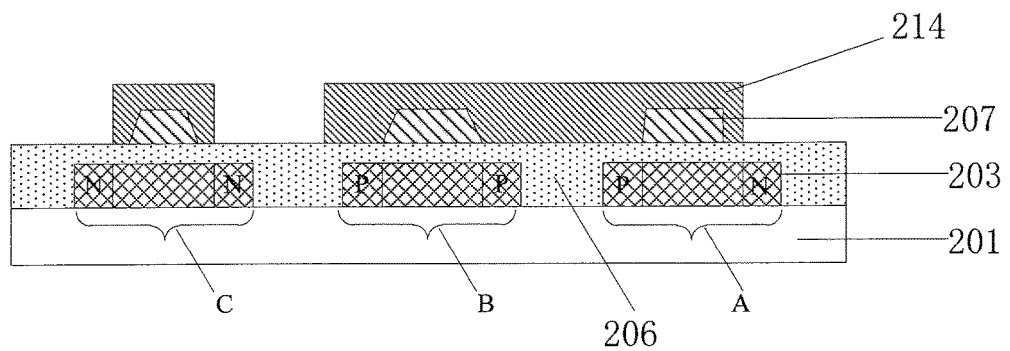
FIGS. 4A to 4B are cross-sectional views illustrating a part of processes of a method for manufacturing the array substrate according to another exemplary embodiment of the present disclosure.
Figure 4B:
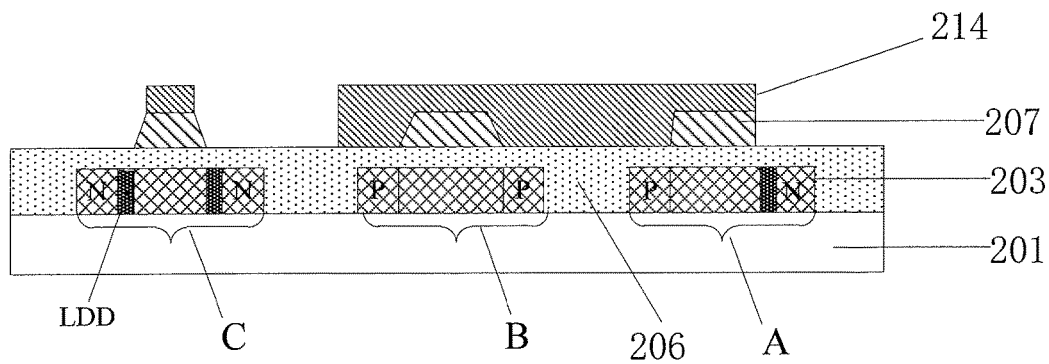
Figure 5:
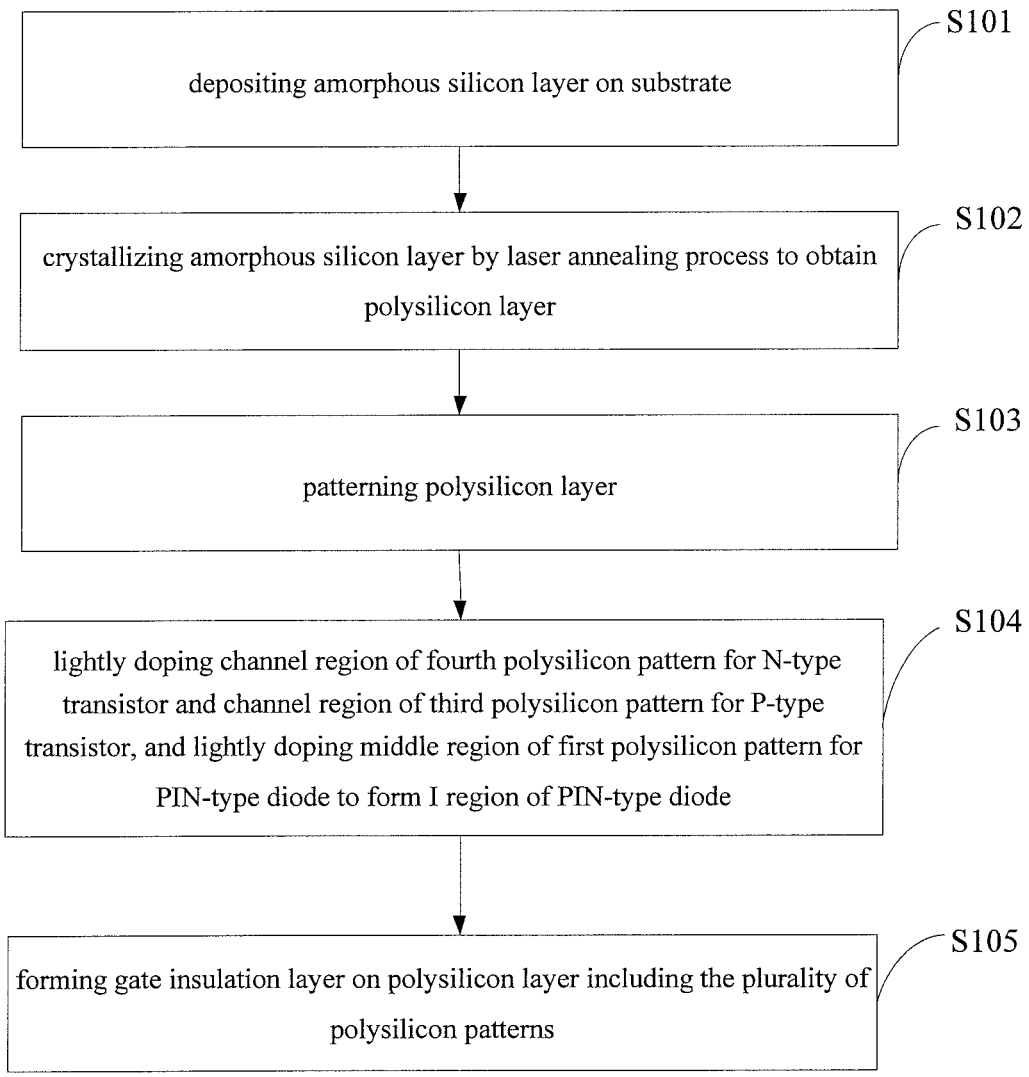
FIG. 5 is a flowchart of a part of processes of the method for manufacturing the array substrate according to an embodiment of the present disclosure.
Figure 8:
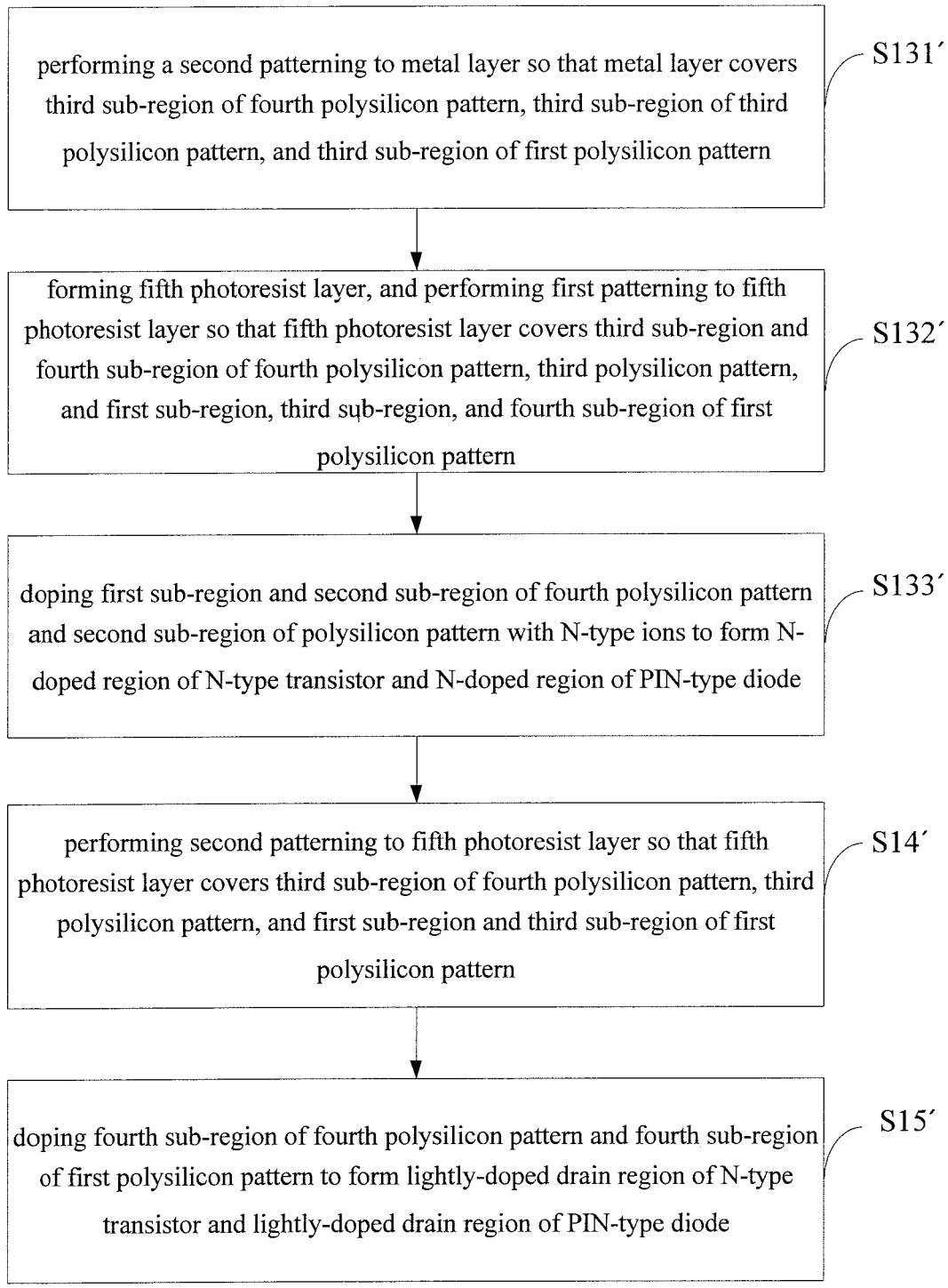
FIG. 8 is a flowchart of a part of processes of the method for manufacturing the array substrate according to a still another embodiment of the present disclosure.
Figure 9:
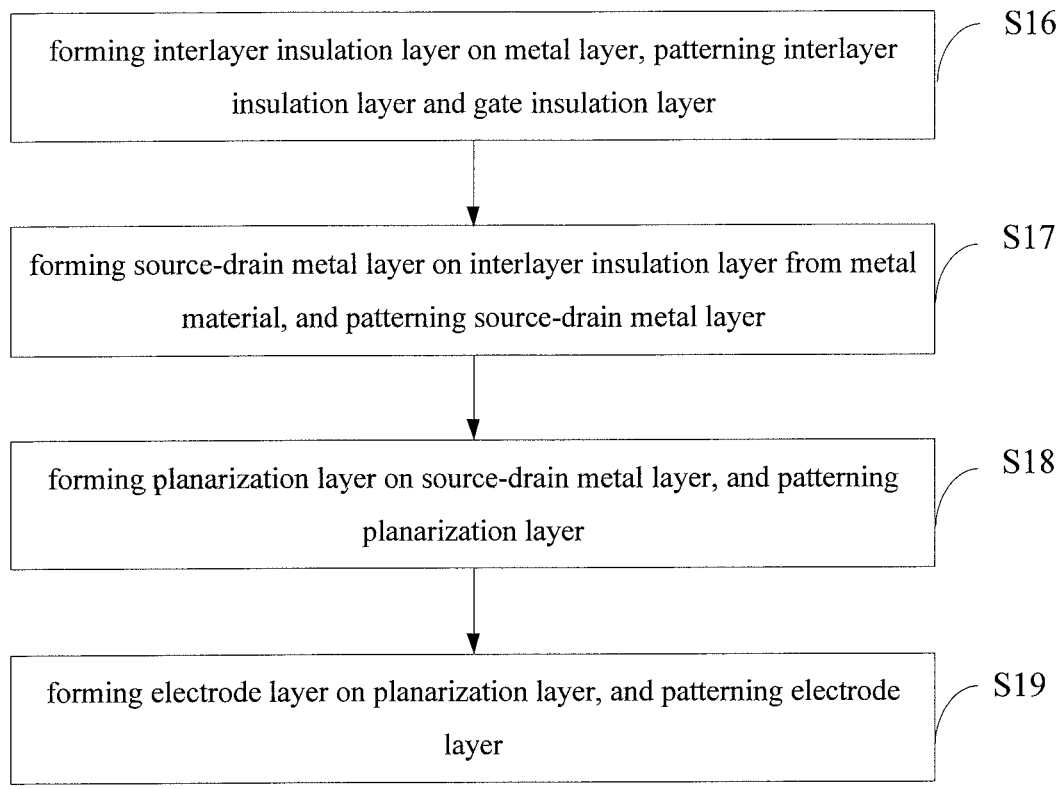
FIG. 9 is a flowchart of a part of processes of the method for manufacturing the array substrate according to a still another embodiment of the present disclosure.

In an exemplary embodiment, the fourth polysilicon pattern C further comprises two fourth sub-regions located between the first sub-region and the third sub-region and between the second sub-region and the third sub-region, respectively; and the first polysilicon pattern A further includes a fourth sub-region between the second sub-region and the third sub-region. Correspondingly, in the above step S13, as shown in FIG. 8, FIG. 4A and FIG. 4B, it includes the following steps:

S131': as shown in FIG. 4A, on the basis of the state shown in FIG. 3G, performing a second patterning to the metal layer 207 so that the metal layer 207 covers the third sub-region of the fourth polysilicon pattern C, the third sub-region of the third polysilicon pattern B, and the third sub-region of the first polysilicon pattern A. In this way, the pattern of the metal layer 207 to which the second patterning has been performed only shields the third sub-region of the fourth polysilicon pattern C (the channel region of the NPN transistor to be formed), the third sub-region of the third polysilicon pattern B (the channel region of the PNP transistor to be formed), and the third sub-region of the first polysilicon pattern A (the I region of the PIN-type diode to be formed), while regions that need to be doped with N-type ions and a region that need to be lightly doped are not shielded by the metal layer 207.

S132': referring to FIG. 4A, forming a fifth photoresist layer 214, and performing a first patterning to the fifth photoresist layer 214 so that the fifth photoresist layer 214 covers the third sub-region and the fourth sub-region of the fourth polysilicon pattern, the entire third polysilicon pattern (the target region corresponding to the P-type transistor to be formed), and the first sub-region, the third sub-region, and the fourth sub-region of the first polysilicon pattern. In this way, the fifth photoresist layer 214 to which the first patterning has been performed shields the channel region of the transistor to be formed, the I region of the PIN-type diode to be formed, the region doped with P ions, and the LDD region, that is, only regions to be doped with N-type ions are not shielded.

S133': further referring to FIG. 4A, taking the fifth photoresist layer 214 to which the first patterning has been performed as a mask, doping the first sub-region and the second sub-region of the fourth polysilicon pattern C and the second sub-region of the polysilicon pattern A in the polysilicon layer 203 with N-type ions to form a N-doped region of the N-type transistor and a N-doped region of the PIN-type diode.

In the method according to the above embodiments, the doping processes of the N-type ions in the relevant regions on the array substrate are completed by the same one process, which reduces the number of process steps and the number of masks, and thereby reduces the process cost.

Further, after the above step S133', as shown in FIGS. 8 and 4B, the following steps may further be included:

S14': as shown in FIG. 4B, performing a second patterning to the fifth photoresist layer 214 so that the fifth photoresist layer 214 covers the third sub-region of the fourth polysilicon pattern C, the entire third polysilicon pattern (the target region corresponding to the P-type transistor to be formed), and the first sub-region and the third sub-region of the first polysilicon pattern. In this way, the fifth photoresist layer 214 to which the second patterning has been performed shields the channel region of the transistor to be formed, the I region of the PIN-type diode to be formed, and the region doped with P ions, that is, only the region doped with N-type ions and the region to be lightly doped are not shielded.

S15': further referring to FIG. 4B, taking the fifth photoresist layer 214 to which the second patterning has been performed as a mask, doping the fourth sub-region of the fourth polysilicon pattern and the fourth sub-region of the first polysilicon pattern of the polysilicon layer 203 to form lightly-doped drain regions of the N-type transistor and a lightly-doped drain region of the PIN-type diode.

Since the region doped with N-type ions is heavily doped, the further light doping to this region will not affect the region doped with N-type ions. In addition, the lightly doped drain region and the region to be doped with N-type ions may be first lightly doped, then the lightly doped drain region may be shielded, and then the doping with N-type ions is performed. Herein, the order of the lightly doping and the doping with N-type ions is limited.

In the method according to the above embodiments, the lightly doping processes in all the regions on the array substrate are completed by the same one process, which further reduces the number of process steps and the number of masks, and thereby reduces the process cost.

The above describes the embodiment in which a P-doped region is formed first and then an N-doped region is formed. In the next alternative embodiment, an N-doped region may be formed first and then a P-doped region may be formed.

Figure 10A:
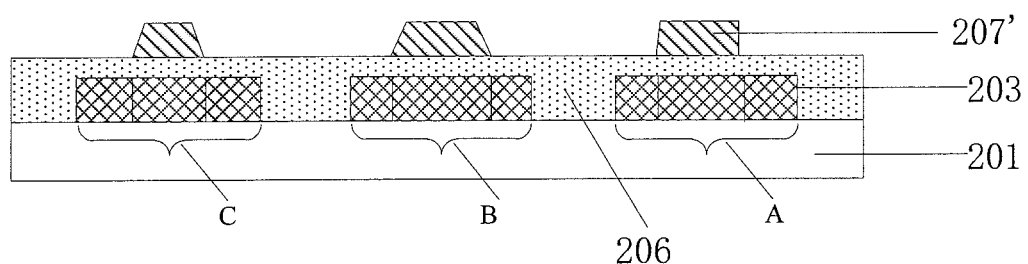
FIGS. 10A to 10D are cross-sectional views of an array substrate illustrating a part of processes of the method for manufacturing the array substrate according to another exemplary embodiment of the present disclosure.

According to another embodiment of the present disclosure, the transistor includes a P-type transistor and an N-type transistor, and the second polysilicon pattern includes a third polysilicon pattern B for forming the P-type transistor and a fourth polysilicon pattern C for forming the N-type transistor. The fourth polysilicon pattern C further includes two fourth sub-regions located between the first sub-region and the third sub-region and between the second sub-region and the third sub-region, respectively; the first polysilicon pattern A further includes a fourth sub-region between the second sub-region and the third sub-region. Referring to FIGS. 10A to 10C and FIG. 11, the method for manufacturing the array substrate according to an exemplary embodiment of the present disclosure, the step S12 includes the following steps:

S21: based on FIG. 3F, referring to FIG. 10A, forming a metal layer 207' (i.e., a gate layer) on the polysilicon layer 203 including the plurality of polysilicon patterns, and performing a first patterning to the metal layer 207', as shown in FIG. 10A, so that the metal layer 207' covers the third sub-region of the fourth polysilicon pattern C (the target region corresponding to the N-type transistor to be formed), the third sub-region of the third polysilicon pattern B, and the third sub-region of the first polysilicon pattern A.

Figure 10B:
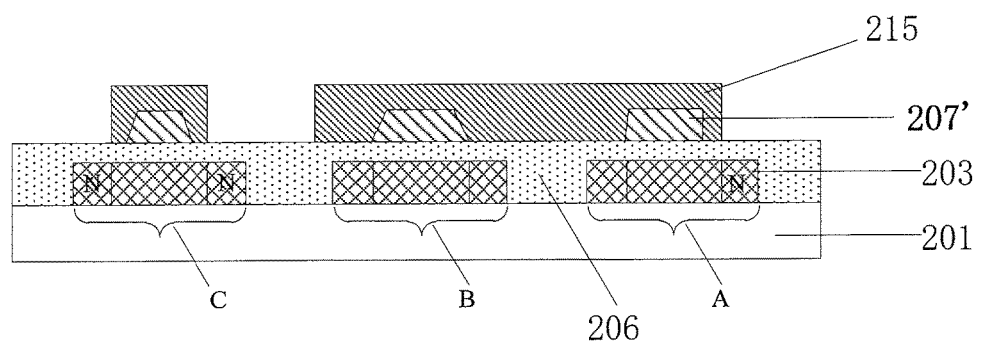

S22: referring to FIG. 10B, forming a sixth photoresist layer 215, and performing a first patterning to the sixth photoresist layer 215 so that the obtained sixth photoresist layer 215 covers the third sub-region and the fourth sub-region of the fourth polysilicon pattern C, the entire third polysilicon pattern B, and the first sub-region, the third sub-region, and the fourth sub-region of the first poly-silicon pattern A. That is, after the first patterning is performed to the sixth photoresist layer 215, only regions to be doped with N-type ions are not shielded.

S23: taking the sixth photoresist layer 215 to which the first patterning has been performed as a mask, doping the first sub-region and the second sub-region of the fourth polysilicon pattern C and the second sub-region of the first polysilicon pattern A with N-type ions to form an N-doped region of the N-type transistor and an N-doped region of the PIN-type diode.

In the above embodiments of the present disclosure, the polysilicon patterns for forming the N-type transistor and the PIN-type diode are doped with N-type ions by the same one process, it may simplify the process steps and save the process cost, in addition to satisfying characteristic parameters of the N-type transistor and the PIN-type diode.

Figure 10C:
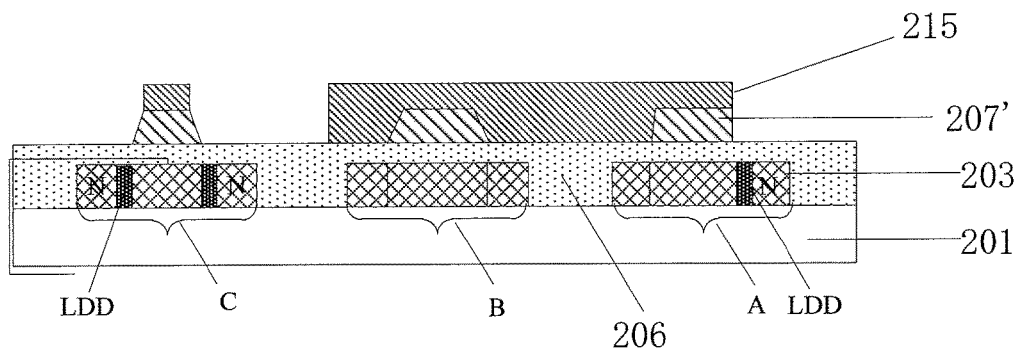
Figure 11:
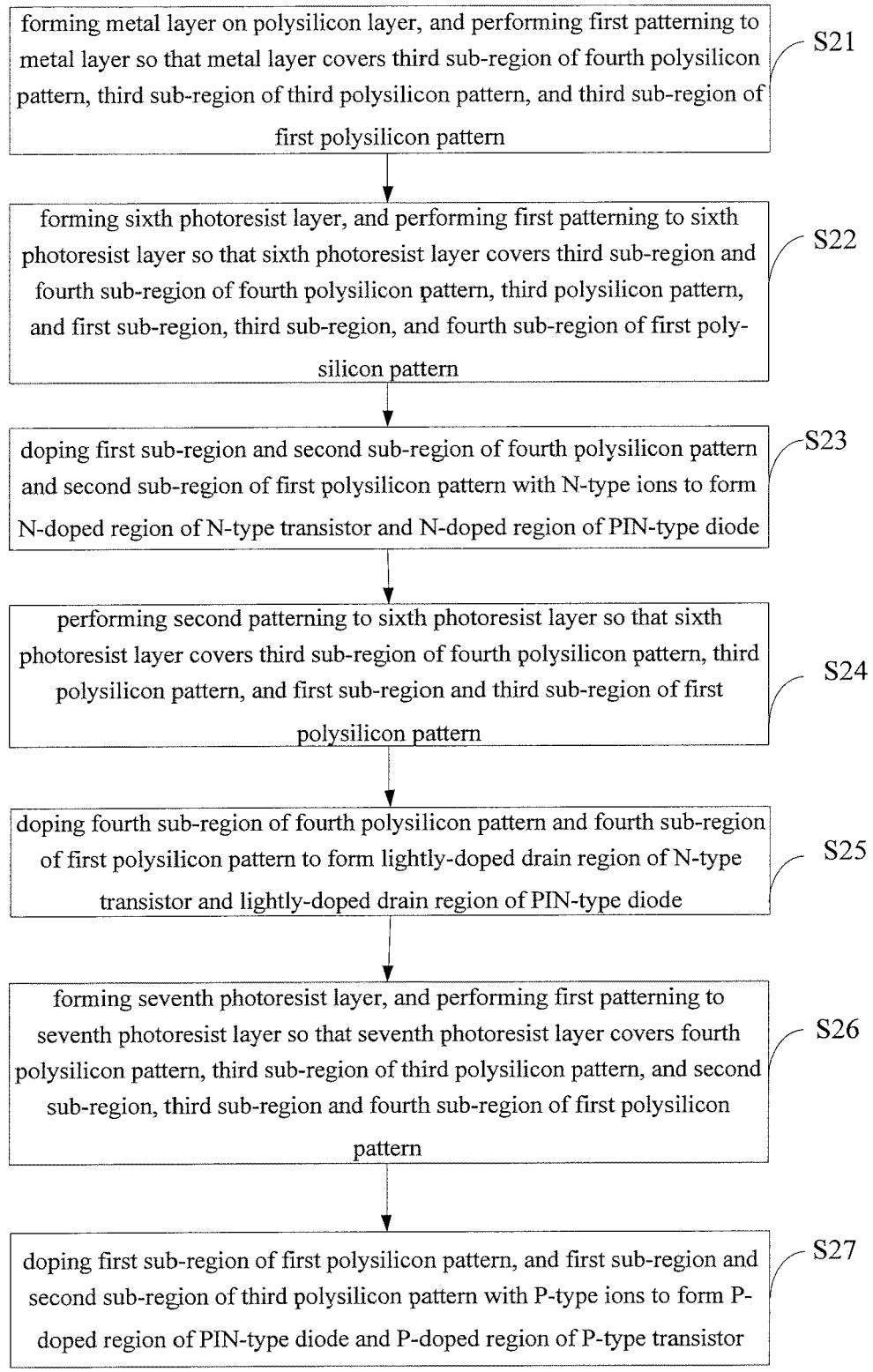
FIG. 11 is a flowchart of a part of processes of the method for manufacturing the array substrate according to an embodiment of the present disclosure.

In an exemplary embodiment, as shown in FIGS. 10C and 11, after the step of doping the first sub-region and the second sub-region of the fourth polysilicon pattern and the second sub-region of the first polysilicon pattern with N-type ions to form the N-doped region of the N-type transistor and the N-doped region of the PIN-type diode, the step S12 further includes the following steps:

S24: as shown in FIG. 10C, performing a second patterning to the sixth photoresist layer 215 so that the sixth photoresist layer 215 covers the third sub-region of the fourth polysilicon pattern C, the entire third polysilicon pattern B (the target region corresponding to the P-type transistor to be formed), and the first sub-region and the third sub-region of the first polysilicon pattern A. In this way, after the second patterning is performed to the sixth photoresist layer 215, only the regions doped with N-type ions and the region to be LDD-doped are not shielded.

S25: taking the sixth photoresist layer 215 to which the second patterning has been performed as a mask, doping the fourth sub-region of the fourth polysilicon pattern C and the fourth sub-region of the first polysilicon pattern A to form a lightly-doped drain region of the N-type transistor and a lightly-doped drain region of the PIN-type diode; thereafter, the sixth photoresist layer 215 is removed.

Figure 10D:
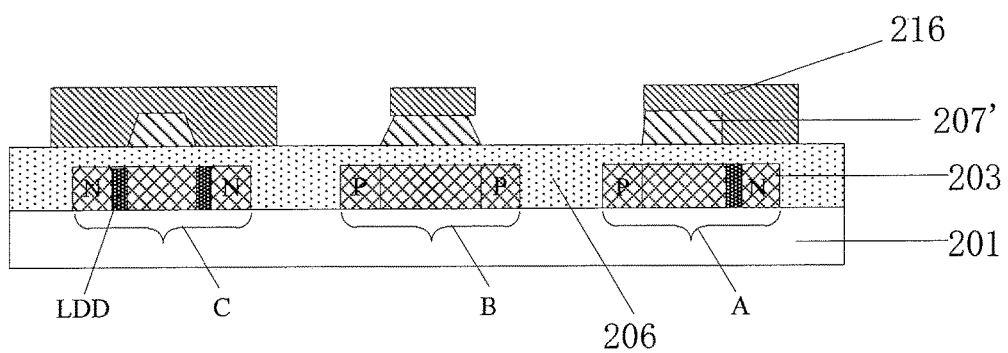

Referring to FIG. 10D and FIG. 11, in the method for manufacturing the array substrate according to an exemplary embodiment of the present disclosure, the step S13 includes the following steps:

S26: based on FIG. 10C, referring to FIG. 10D, forming a seventh photoresist layer 216, and performing a first patterning to the seventh photoresist layer 216 so that the seventh photoresist layer 216 covers the entire fourth polysilicon pattern (the target region corresponding to the N-type transistor to be formed), the third sub-region of the third polysilicon pattern B, and the second sub-region, the third sub-region and the fourth sub-region of the first polysilicon pattern A. In this way, after the first patterning is performed to the seventh photoresist layer 216, only regions to be doped with P-type ions are not shielded by the seventh photoresist layer 216.

S27: referring to FIG. 10D, taking the seventh photoresist layer 216 to which the first patterning has been performed as a mask, doping the first sub-region of the first polysilicon pattern A, and the first sub-region and the second sub-region of the third polysilicon pattern B with P-type ions to form a P-doped region of the PIN-type diode and a P-doped region of the P-type transistor.

In the method according to the above embodiments of the present disclosure, the step of doping with N-type ion in the PIN-type diode and the N-type transistor may be implemented by the first doping process, and the step of doping with P-type ion in the PIN-type diode and the P-type transistor may be implemented by the second doping process. Thus, it realizes the integration of the manufacturing process of the transistor and the manufacturing process of the PIN-type diode, thereby simplifying the processes of the array substrate and reducing the cost.

Figure 3L:
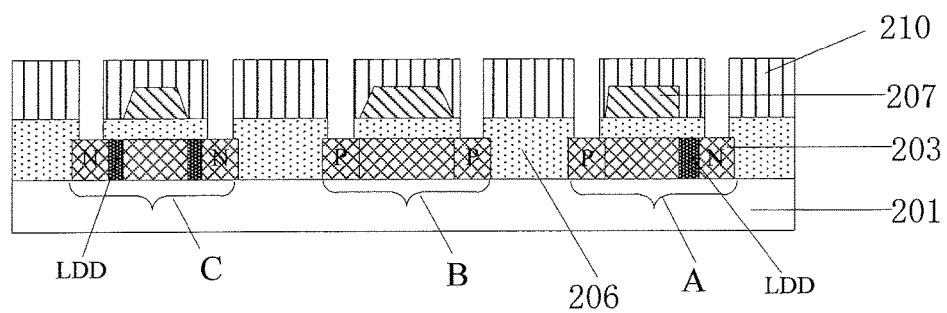

Further, in the above method according to the embodiments of the present disclosure, based on FIG. 3K, after the step of doping the fourth polysilicon pattern for forming the N-type transistor, the third polysilicon pattern for forming the P-type transistor, and the first polysilicon pattern for forming the PIN-type diode and removing the second photoresist layer 209, as shown in FIGS. 3L-3O and FIG. 9, the following steps may also be included:

S16: as shown in FIG. 3L, forming an interlayer insulation layer 210 (ILD) on the metal layer 207, patterning the interlayer insulation layer 210 and the gate insulation layer 206 to expose the region doped with P-type ions and the region doped with N-type ions, i.e., expose a source conductive region and a drain conductive region of the transistor to be formed, and a P region and an N region of the PIN-type diode to be formed.

Figure 3M:
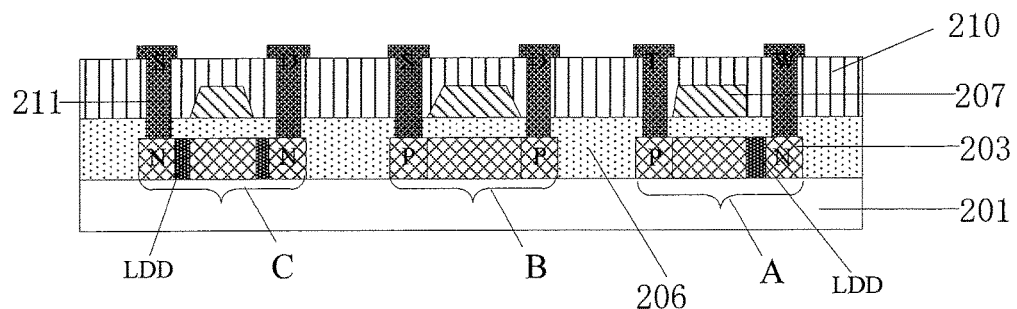

S17: as shown in FIG. 3M, forming a source-drain metal layer 211 on the interlayer insulation layer 210 from a metal material, and patterning the source-drain metal layer 211 to form a source electrode (S) and a drain electrode (D) of the transistor, and a first electrode (T) and a second electrode (W) of the PIN-type diode.

Figure 3N:
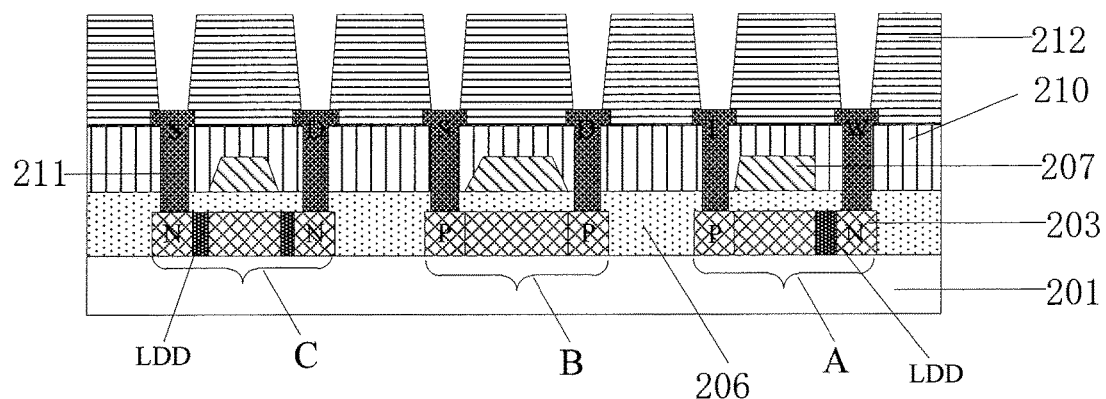

S18: as shown in FIG. 3N, forming a planarization layer 212 on the source-drain metal layer 211, and patterning the planarization layer 212 to expose the source electrode (S) and the drain electrode (D) of the transistor, and the first electrode (T) and the second electrode (W) of the PIN-type diode.

Figure 3O:
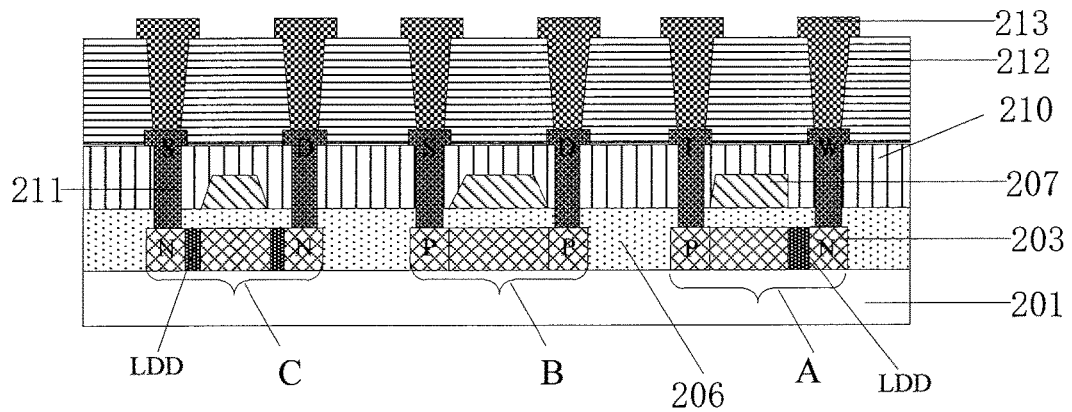

S19: as shown in FIG. 3O, forming an electrode layer 213 on the planarization layer 212, and patterning the electrode layer 213 to form electrodes for connecting the source electrode (S) and the drain electrode (D) of the transistor, and electrodes for connecting the first electrode (T) and the second electrode (W) of the PIN-type diode, respectively. Specifically, the electrode layer may be made from a transparent metal oxide conductive material, such as indium tin oxide (ITO), or any other materials. The material is not limited herein.

Based on the same creative concept of the present disclosure, an embodiment of the present disclosure further provides an array substrate, which is manufactured by the above method. Since the operation principle of the array substrate in aspect of solving problem is similar to that of the above-mentioned method for manufacturing the array substrate, the implementation of the array substrate may refer to the implementation of the above-mentioned method for manufacturing the array substrate, and the repeated description is omitted.

Based on the same creative concept of the present disclosure, an embodiment of the present disclosure also provides a fingerprint recognition device including the above array substrate. Since the operation principle of the fingerprint recognition device in aspect of solving problem is similar to that of the above-mentioned array substrate, the implementation of the fingerprint recognition device may refer to the implementation of the above-mentioned array substrate, and the repeated description is omitted.

In addition, the above array substrate may be applied to a display device, for example, a mobile phone, a tablet computer, a television, a display, a notebook computer, a digital photo frame, a navigator, and any product or component having a display function.

According to the method for manufacturing the array substrate, the array substrate and the fingerprint recognition device provided by the embodiments of the present disclosure, the first sub-region and the second sub-region of the polysilicon pattern for forming the transistor is doped in the same process as the first doping process or the second doping process. Thus, it realizes the integration of the manufacturing process of the transistor and the manufacturing process of the PIN-type diode, thereby simplifying the processes of the array substrate and reducing the cost.

It will be apparent for those skilled in the art that various modifications and variations may be made to the present disclosure without departing from the spirit and scope of the present disclosure. Thus, if these modifications and variations made to the present disclosure fall within the scope of the claims of the present disclosure and equivalent thereof, the present disclosure also intends to include these modifications and variations.

What is claimed is:

1. A method for manufacturing an array substrate comprising a plurality of target region groups, each target region groups comprising a PIN-type diode and a transistor, and the method for manufacturing the array substrate comprising steps of:

forming a plurality of polysilicon patterns on a substrate, the plurality of polysilicon patterns comprising a first polysilicon pattern for forming the PIN-type diode and a second polysilicon pattern for forming the transistor, each polysilicon pattern comprising a first sub-region, a second sub-region, and a third sub-region between the first sub-region and the second sub-region;

using a first doping process to dope the first sub-region of the first polysilicon pattern, and the first sub-region and the second sub-region of the second polysilicon pattern with one of P-type ions and N-type ions, respectively; and using a second doping process to dope the second sub-region of the first polysilicon pattern with the other of the P-type ions and the N-type ions;

wherein the transistor comprises a P-type transistor and an N-type transistor and the second polysilicon pattern comprises a third polysilicon pattern for forming the P-type transistor and a fourth polysilicon pattern for forming the N-type transistor, the fourth polysilicon pattern further comprises two fourth sub-regions located between the first sub-region and the third sub-region and between the second sub-region and the third sub-region, respectively; and wherein the step of using the first doping process to dope the first sub-region of the first pattern with the one of P-type ions and N-type ions, respectively comprises steps of:

forming a metal layer on the plurality of polysilicon patterns, and performing a first patterning to the metal layer so that the metal layer covers the fourth polysilicon pattern, the third sub-region of the third polysilicon pattern, and the second sub-region and the third sub-region of the first polysilicon pattern: and doping the first sub-region of the first polysilicon pattern, and the first sub-region and the second sub-region of the third polysilicon pattern with the P-type ions. to form a P-doped. region of the PIN-type diode and a P-doped region of the P-type transistor.

2. The method according to claim 1, wherein the step of using the second doping process to dope the second sub-region of the first polysilicon pattern with the other of the P-type ions and the N-type ions comprises steps of:

performing a second patterning to the metal layer so that the metal layer covers the third sub-region of the fourth polysilicon pattern, the third sub-region of the third polysilicon pattern, and the second sub-region and the third sub-region of the first polysilicon pattern;

forming a first photoresist layer, and performing a first patterning to the first photoresist layer so that the first photoresist layer covers the third sub-region and the fourth sub-region of the fourth polysilicon pattern, the third polysilicon pattern, and the first polysilicon pattern; and doping the first sub-region and the second sub-region of the fourth polysilicon pattern with the N-type ions, to form an N-doped region of the N-type transistor.

3. The method according to claim 2, wherein the step of using the second doping process to dope the second sub-region of the first polysilicon pattern with the other of the P-type ions and the N-type ions further comprises steps of:

performing a second patterning to the first photoresist layer so that the first photoresist layer covers the third sub-region of the fourth polysilicon pattern, the third polysilicon pattern, and the first polysilicon pattern; and doping the fourth sub-region of the fourth polysilicon pattern, to form a lightly-doped drain region of the N-type transistor.

4. The method according to claim 3, wherein the first polysilicon pattern further comprises a fourth sub-region located between the second sub-region and the third sub-region, and wherein the step of using the second doping process to dope the second sub-region of the first polysilicon pattern with the other of the P-type ions and the N-type ions further comprises steps of:

performing a third patterning to the metal layer so that the metal layer covers the third sub-region of the fourth polysilicon pattern, the third sub-region of the third polysilicon pattern, and the third sub-region of the first polysilicon pattern;

forming a second photoresist layer, and performing a first patterning to the second photoresist layer so that the second photoresist layer covers the fourth polysilicon pattern, the third polysilicon pattern, and the first sub-region, the third sub-region and the fourth sub-region of the first polysilicon pattern; and doping the second sub-region of the first polysilicon pattern with the N-type ions, to form an N-doped region of the PIN-type diode.

5. The method according to claim 4, wherein, after the step of doping the second sub-region of the first polysilicon pattern with the N-type ions, the method further comprises steps of:

performing a second patterning to the second photoresist layer so that the second photoresist layer covers the fourth polysilicon pattern, the third polysilicon pattern, and the first sub-region and the third sub-region of the first polysilicon pattern; and doping the fourth sub-region of the first polysilicon pattern, to form a lightly-doped drain region of the PIN-type diode.

6. The method according to claim 1, wherein the first polysilicon pattern further comprises a fourth sub-region located between the second sub-region and the third sub-region, and wherein the step of using the second doping process to dope the second sub-region of the first polysilicon pattern with the other of the P-type ions and the N-type ions comprises:

performing a second patterning to the metal layer so that the metal layer covers the third sub-region of the fourth polysilicon pattern, the third sub-region of the third polysilicon pattern, and the third sub-region of the first polysilicon pattern;

forming a fifth photoresist layer, and performing a first patterning to the fifth photoresist layer so that the fifth photoresist layer covers the third sub-region and the fourth sub-region of the fourth polysilicon pattern, the third polysilicon pattern, and the first sub-region, the third sub-region and the fourth sub-region of the first polysilicon pattern; and doping the first sub-region and the second sub-region of the fourth polysilicon pattern and the second sub-region of the first polysilicon pattern with the N-type ions, to form an N-doped region of the N-type transistor and an N-doped region of the PIN-type diode.

7. The method according to claim 6, wherein, after the step of doping the first sub-region and the second sub-region of the fourth polysilicon pattern and the second sub-region of the first polysilicon pattern with the N-type ions, to form the N-doped region of the N-type transistor and the N-doped region of the PIN-type diode, the method further comprises steps of:

performing a second patterning to the fifth photoresist layer so that the fifth photoresist layer covers the third sub-region of the fourth polysilicon pattern, the third polysilicon pattern, and the first sub-region and the third sub-region of the first polysilicon pattern; and doping the fourth sub-region of the fourth polysilicon pattern and the fourth sub-region of the first polysilicon pattern, to form a lightly-doped drain region of the N-type transistor and a lightly-doped drain region of the PIN-type diode.

8. The method according to claim 1, wherein the first polysilicon pattern further comprises a fourth sub-region located between the second sub-region and the third sub-region, and wherein the step of using the first doping process to dope the first sub-region of the first polysilicon pattern, and the first sub-region and the second sub-region of the second polysilicon pattern with one of the P-type ions and the N-type ions respectively comprises steps of:

forming a metal layer on the plurality of polysilicon patterns, and performing a first patterning to the metal layer so that the metal layer covers the third sub-region of the fourth polysilicon pattern, the third sub-region of the third polysilicon pattern, and the third sub-region of the first polysilicon pattern;

forming a sixth photoresist layer, and performing a first patterning to the sixth photoresist layer so that the sixth photoresist layer covers the third sub-region and the fourth sub-region of the fourth polysilicon pattern, the third polysilicon pattern, and the first sub-region, the third sub-region, and the fourth sub-region of the first polysilicon; and doping the first sub-region and the second sub-region of the fourth polysilicon pattern and the second sub-region of the first polysilicon pattern with the N-type ions, to form an N-doped region of the N-type transistor and an N-doped region of the PIN-type diode.

9. The method according to claim 8, wherein, after the step of doping the first sub-region and the second sub-region of the fourth polysilicon pattern and the second sub-region of the first polysilicon pattern with the N-type ions, to form the N-doped region of the N-type transistor and the N-doped region of the PIN-type diode, the method further comprises steps of:

performing a second patterning to the sixth photoresist layer so that the sixth photoresist layer covers the third sub-region of the fourth polysilicon pattern, the third polysilicon pattern, and the first sub-region and the third sub-region of the first polysilicon pattern; and doping the fourth sub-region of the fourth polysilicon pattern and the fourth sub-region of the first polysilicon pattern, to form a lightly-doped drain region of the N-type transistor and a lightly-doped drain region of the PIN-type diode.

10. The method according to claim 9, wherein the step of using the second doping process to dope the second sub-region of the first polysilicon pattern with the other of the P-type ions and the N-type ions further comprises steps of:

forming a seventh photoresist layer, and patterning the seventh photoresist layer so that the seventh photoresist layer covers the fourth polysilicon pattern, the third sub-region of the third polysilicon pattern, and the second sub-region, the third sub-region and the fourth sub-region of the first polysilicon pattern; and doping the first sub-region of the first polysilicon pattern, and the first sub-region and the second sub-region of the third polysilicon pattern with the P-type ions, to form a P-doped region of the PIN-type diode and a P-doped region of the P-type transistor.

11. The method according to claim 1, wherein, after the step of forming the plurality of polysilicon patterns on the substrate, the method further comprises steps of:

forming a third photoresist layer covering the fourth polysilicon pattern; and lightly doping the third polysilicon pattern and the first polysilicon pattern, to form a channel region of the P-type transistor having a threshold voltage and an I region of the PIN-type diode.

12. The method according to claim 1, wherein, after the step of forming the plurality of polysilicon patterns on the substrate, the method further comprises steps of:

forming a fourth photoresist layer covering the first polysilicon pattern and the third polysilicon pattern; and lightly doping the fourth polysilicon pattern, to form a channel region of the N-type transistor having a threshold voltage.

* * * * *